United States Patent
Choi et al.

(10) Patent No.: US 11,302,660 B2
(45) Date of Patent: Apr. 12, 2022

(54) SEMICONDUCTOR DEVICES AND SEMICONDUCTOR PACKAGES INCLUDING THE SAME

(71) Applicant: Samsung Electronics Co., Ltd., Suwon-si (KR)

(72) Inventors: Ju-Il Choi, Seongnam-si (KR); Un-Byoung Kang, Hwaseong-si (KR); Jin Ho An, Seoul (KR); Jongho Lee, Hwaseong-si (KR); Jeonggi Jin, Seoul (KR); Atsushi Fujisaki, Seongnam-si (KR)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 16/803,529

(22) Filed: Feb. 27, 2020

(65) Prior Publication Data
US 2020/0402935 A1   Dec. 24, 2020

(30) Foreign Application Priority Data
Jun. 24, 2019 (KR) .......... 10-2019-0075216

(51) Int. Cl.
H01L 23/00 (2006.01)

(52) U.S. Cl.
CPC .............. *H01L 24/05* (2013.01); *H01L 24/03* (2013.01); *H01L 24/11* (2013.01); *H01L 24/13* (2013.01); *H01L 2224/0346* (2013.01); *H01L 2224/03614* (2013.01); *H01L 2224/0401* (2013.01); *H01L 2224/0508* (2013.01); *H01L 2224/05016* (2013.01); *H01L 2224/05144* (2013.01); *H01L 2224/05147* (2013.01); *H01L 2224/05155* (2013.01); *H01L 2224/11849* (2013.01); *H01L 2224/13026* (2013.01); *H01L 2224/13111* (2013.01); *H01L 2224/13113* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01)

(58) Field of Classification Search
CPC ......... H01L 24/05; H01L 24/03; H01L 24/11; H01L 24/13; H01L 2224/0346; H01L 2224/03614; H01L 2224/0401; H01L 2224/05016; H01L 21/4857; H01L 23/5383
See application file for complete search history.

(56) References Cited

U.S. PATENT DOCUMENTS

| | | | |
|---|---|---|---|
| 6,798,050 B1 | 9/2004 | Homma et al. |
| 7,642,647 B2 | 1/2010 | Minda |
| 8,659,155 B2 | 2/2014 | Cheng et al. |
| 9,455,183 B2 | 9/2016 | Hsiao et al. |

(Continued)

*Primary Examiner* — Douglas W Owens
(74) *Attorney, Agent, or Firm* — Myers Bigel, P.A.

(57) ABSTRACT

Semiconductor devices are provided. A semiconductor device includes an insulating layer and a conductive element in the insulating layer. The semiconductor device includes a first barrier pattern in contact with a surface of the conductive element and a surface of the insulating layer. The semiconductor device includes a second barrier pattern on the first barrier pattern. Moreover, the semiconductor device includes a metal pattern on the second barrier pattern. Related semiconductor packages are also provided.

19 Claims, 11 Drawing Sheets

(56) References Cited

U.S. PATENT DOCUMENTS

| | | |
|---|---|---|
| 9,472,524 B2 | 10/2016 | Chen et al. |
| 9,598,772 B2 | 3/2017 | Lin et al. |
| 2012/0098124 A1 | 4/2012 | Wu et al. |
| 2019/0053373 A1* | 2/2019 | Lu ........................ H01L 23/3171 |
| 2019/0385964 A1* | 12/2019 | Choi ........................ H01L 24/06 |

* cited by examiner

SEMICONDUCTOR DEVICES AND SEMICONDUCTOR PACKAGES INCLUDING THE SAME

CROSS-REFERENCE TO RELATED APPLICATION(S)

This U.S. non-provisional patent application claims priority under 35 U.S.C. § 119 to Korean Patent Application No. 10-2019-0075216, filed on Jun. 24, 2019, in the Korean Intellectual Property Office, the entire contents of which are hereby incorporated by reference.

BACKGROUND

The present disclosure relates to semiconductor devices and, in particular, to semiconductor packages including a semiconductor device. A semiconductor package, in which a semiconductor chip is included, makes it possible to easily use the semiconductor chip as a part of an electronic product. Conventionally, a semiconductor package includes a printed circuit board (PCB) and a semiconductor chip, which is mounted on the PCB and is electrically connected to the PCB using bonding wires or bumps. With development of the electronics industry, many studies are being conducted to improve reliability and durability of semiconductor packages.

SUMMARY

Some embodiments of the inventive concepts provide a semiconductor device with improved reliability. Moreover, some embodiments of the inventive concepts provide a semiconductor package with improved reliability.

According to some embodiments of the inventive concepts, a semiconductor device may include a first insulating layer. The semiconductor device may include a conductive element in the first insulating layer. The semiconductor device may include a first barrier pattern in contact with a surface of the conductive element and a surface of the first insulating layer. The semiconductor device may include a second barrier pattern on the first barrier pattern. Moreover, the semiconductor device may include a first metal pattern on the second barrier pattern. A width of the first barrier pattern may be smaller than a width of the first metal pattern, and a width of the second barrier pattern may be smaller than the width of the first barrier pattern.

According to some embodiments of the inventive concepts, a semiconductor device may include an insulating layer. The semiconductor device may include a conductive element in the insulating layer. The semiconductor device may include a first barrier pattern in contact with a surface of the conductive element and a surface of the insulating layer. Moreover, the semiconductor device may include a metal pattern on the first barrier pattern. A thickness of the first barrier pattern may range from 10 angstroms (Å) to 100 Å, and the first barrier pattern may include metal nitride.

According to some embodiments of the inventive concepts, a semiconductor package may include a board and a first semiconductor package mounted on the board. The first semiconductor package may include a re-distribution layer, a semiconductor chip on the re-distribution layer, and a terminal structure between the re-distribution layer and the board. The re-distribution layer may include an insulating layer and a conductive element in the insulating layer. The terminal structure may include a first barrier pattern and a second barrier pattern that are sequentially stacked on a surface of the conductive element and a surface of the insulating layer. The terminal structure may include a metal pattern on the second barrier pattern, and a connection terminal between the metal pattern and the board. A width of the second barrier pattern may be smaller than a width of the first barrier pattern and a width of the metal pattern. The second barrier pattern may include titanium.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
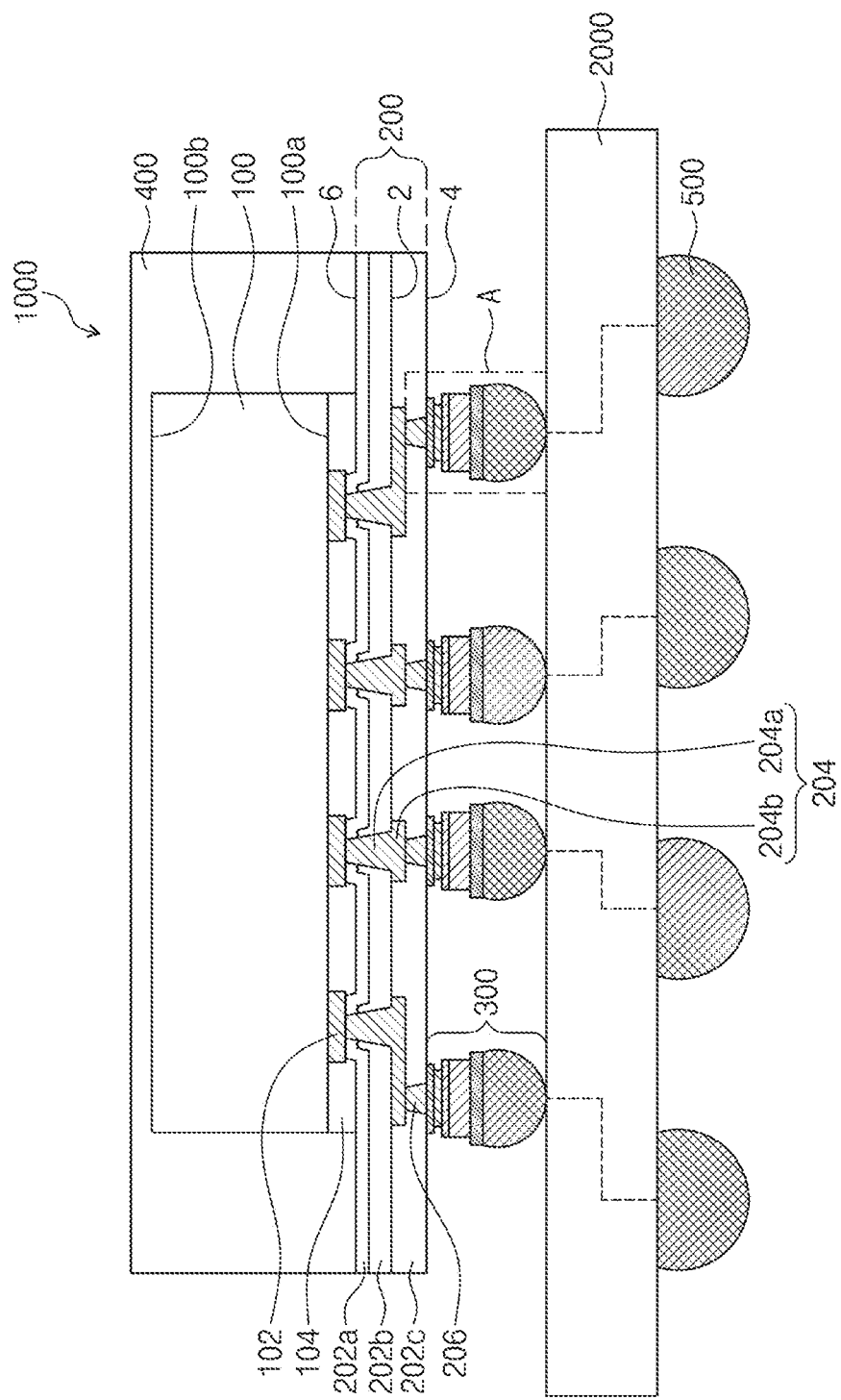
FIG. 1 is a sectional view illustrating a semiconductor package including a semiconductor device according to some embodiments of the inventive concepts.
Figure 2A:
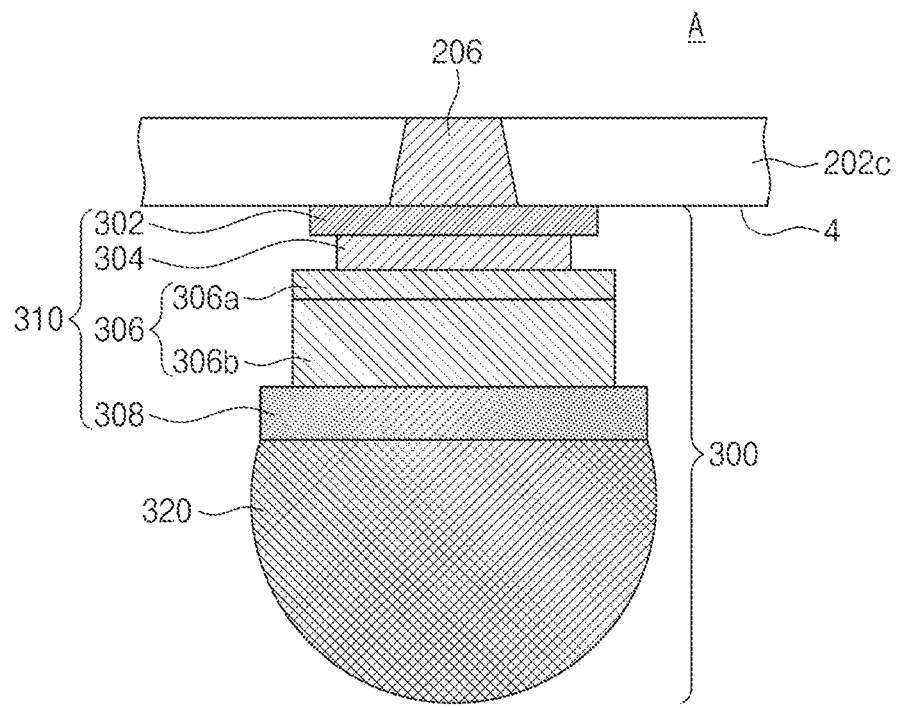
FIG. 2A is an enlarged sectional view illustrating a portion A of FIG. 1.
Figure 2B:
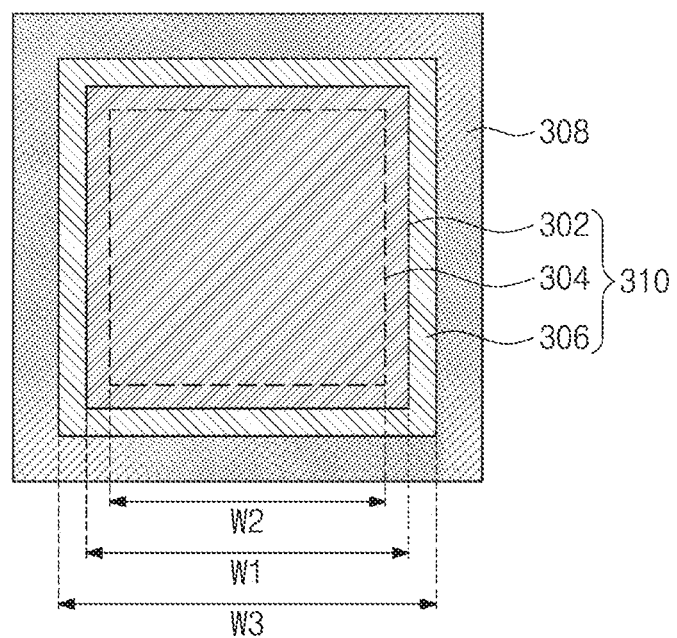
FIG. 2B is a plan view illustrating an under-bump metallurgy (UBM) layer of FIG. 2A.
Figure 2C:
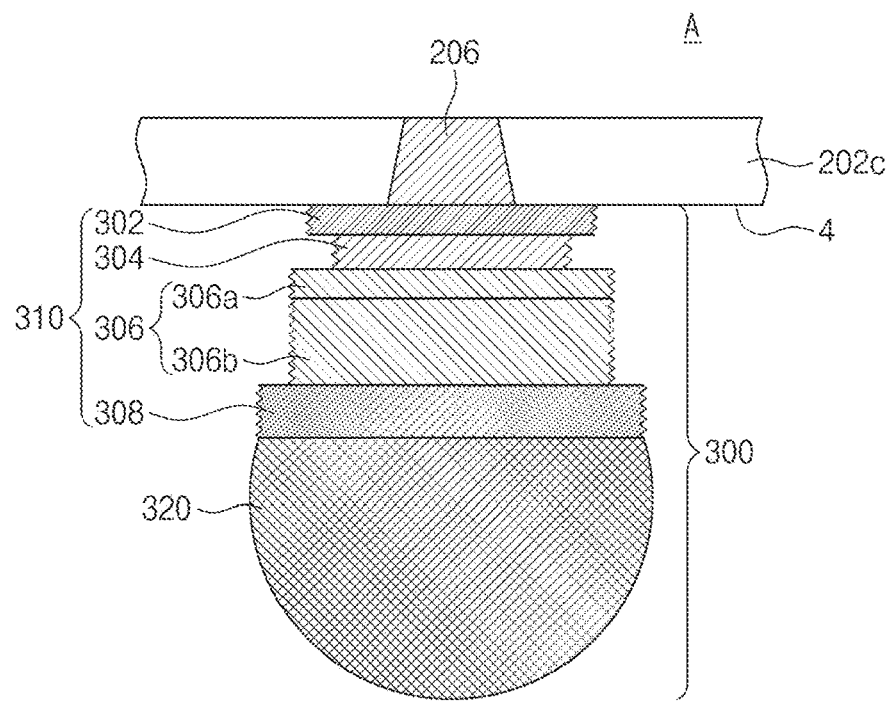
FIG. 2C is an enlarged sectional view illustrating the portion A of FIG. 1.
Figure 2D:
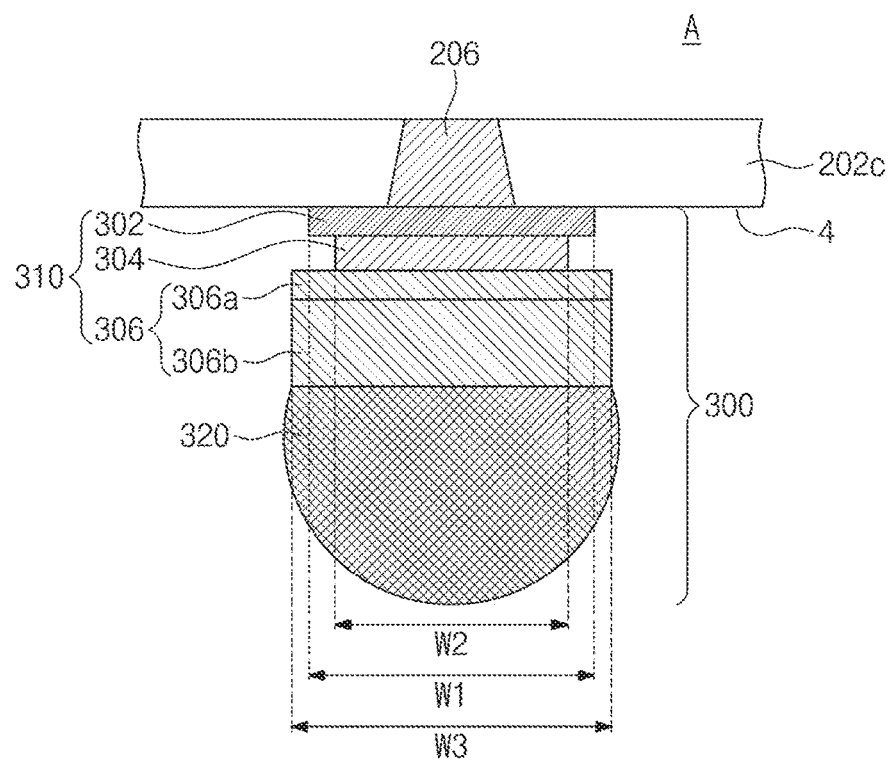
FIG. 2D is an enlarged sectional view illustrating the portion A of FIG. 1.

FIG. 1 is a sectional view illustrating a semiconductor package including a semiconductor device according to some embodiments of the inventive concepts. FIG. 2A is an enlarged sectional view illustrating a portion A of FIG. 1. FIG. 2B is a plan view illustrating an under-bump metallurgy (UBM) layer of FIG. 2A. FIG. 2C is an enlarged sectional view illustrating the portion A of FIG. 1. FIG. 2D is an enlarged sectional view illustrating the portion A of FIG. 1. Accordingly, FIGS. 2A, 2C, and 2D are different examples of the portion A of FIG. 1.

Referring to FIG. 1, a first semiconductor package 1000 may include a first semiconductor chip 100, a first re-distribution layer 200, first terminal structures 300, and a mold layer 400. The first semiconductor chip 100 may include a first surface 100a and a second surface 100b, which are opposite to each other. The first surface 100a may be an active surface of the first semiconductor chip 100, and the second surface 100b may be an inactive surface of the first semiconductor chip 100. First chip pads 102 may be disposed on the first surface 100a of the first semiconductor chip 100. The first chip pads 102 may be in contact with the first surface 100a of the first semiconductor chip 100. The first chip pads 102 may include a metallic material, such as aluminum. A first protection layer 104 may be disposed on the first surface 100a of the first semiconductor chip 100. The first protection layer 104 may cover side surfaces of the first chip pads 102 and expose other specific surfaces (e.g., surfaces that are parallel to, and do not contact, the first surface 100a) of the first chip pads 102. The first protection layer 104 may include a single layer or a plurality of layers.

The first re-distribution layer 200 may be disposed on the first surface 100a of the first semiconductor chip 100. The first protection layer 104 may be disposed between the first surface 100a of the first semiconductor chip 100 and the first re-distribution layer 200. The first re-distribution layer 200 may include first to third insulating layers 202a, 202b, and 202c, a plurality of redistributions 204, and a plurality of vias 206. The first to third insulating layers 202a, 202b, and 202c may be sequentially stacked on the first protection layer 104. The number of the insulating layers is not limited to the illustrated example and may be four or more. The first to third insulating layers 202a, 202b, and 202c may be formed of or include a polymer layer or a silicon oxide layer. The polymer layer may be a photosensitive polymer (e.g., photosensitive polyimide (PSPI), polybenzoxazole (PBO), phenolic polymer, or benzocyclobutene polymer (BCB)). The redistributions 204 may be disposed in the first and second insulating layers 202a and 202b. Each of the redistributions 204 may be provided to correspond to a respective one of the first chip pads 102, and each of the redistributions 204 and each of the first chip pads 102 corresponding to each other may be electrically and physically connected to each other. Each of the redistributions 204 may include a first portion 204a and a second portion 204b. The first portion 204a may be provided to penetrate at least the first and second insulating layers 202a and 202b and may be in contact with the first chip pads 102. The second portion 204b may be disposed on the first portion 204a and a specific surface 2 of the second insulating layer 202b. The second portion 204b may be in contact with the specific surface 2 of the second insulating layer 202b. In some embodiments, the second portion 204b may have a line shape. The redistributions 204 may include a plurality of conductive layers. The redistributions 204 may be formed of or include at least one of metallic materials or metal nitrides. The metallic materials may include at least one of, for example, titanium (Ti), copper (Cu), nickel (Ni), or gold (Au). The metal nitrides may include, for example, titanium nitride (TiN). The plurality of the vias 206 may be provided in the third insulating layer 202c and on the redistributions 204. Each of the vias 206 may be disposed to correspond to a respective one of the redistributions 204. The vias 206 may be in contact with the redistributions 204 and the vias 206 may be electrically connected to the redistributions 204. The vias 206 may be exposed on (and/or may have respective surfaces that are coplanar with) a specific surface 4 of the third insulating layer 202c. In some embodiments, the vias 206 may be conductive and thus may be referred to as conductive elements. Other examples of conductive elements that may be in an insulating layer according to the inventive concepts include a redistribution or a pad.

The first terminal structures 300 may be disposed on the specific surface 4 of the third insulating layer 202c. Each of the first terminal structures 300 may be disposed to correspond to a respective one of the vias 206. The first terminal structures 300 may be in contact with and electrically connected to the vias 206. Referring to FIG. 2B, each of the first terminal structures 300 may include an UBM layer 310 and a connection terminal 320. The UBM layer 310 may include a first barrier pattern 302, a second barrier pattern 304, a metal pattern 306, and a metal film 308, which are sequentially stacked on the specific surface 4 of the third insulating layer 202c.

The first barrier pattern 302 may cover the specific surface 4 of the third insulating layer 202c and a specific surface of the via 206, which is exposed by (and/or is coplanar with) the third insulating layer 202c. The first barrier pattern 302 may be in contact with the specific surface 4 of the third insulating layer 202c and the specific surface of the via 206. The first barrier pattern 302 may be formed to have a thin thickness. For example, the thickness of the first barrier pattern 302 may range from about 10 angstroms (Å) to about 100 Å. The first barrier pattern 302 may be formed of or include at least one of metal nitrides. For example, the first barrier pattern 302 may be formed of or include titanium nitride (TiN). The second barrier pattern 304 may be disposed on the first barrier pattern 302. The second barrier pattern 304 may be in contact with a specific surface of the first barrier pattern 302. The second barrier pattern 304 may serve as a diffusion barrier layer. The second barrier pattern 304 may be formed of or include a metallic material. A metallic element included in the second barrier pattern 304 may be the same as a metallic element included in the first barrier pattern 302. For example, the second barrier pattern 304 may include titanium (Ti). The metal pattern 306 may be disposed on the second barrier pattern 304. The metal pattern 306 may be in contact with a specific surface of the second barrier pattern 304. The metal pattern 306 may include a first metal pattern 306a and a second metal pattern 306b, which are sequentially stacked on the specific surface of the second barrier pattern 304. The second metal pattern 306b may be thicker than the first metal pattern 306a. The first metal pattern 306a and the second metal pattern 306b may be formed of or include the same metallic material. The first metal pattern 306a and the second metal pattern 306b may be formed of or include, for example, copper (Cu).

Referring to FIGS. 2A and 2B, in some embodiments, a width W1 of the first barrier pattern 302, a width W2 of the second barrier pattern 304, and a width W3 of the metal pattern 306 may differ from each other. The width W3 of the metal pattern 306 may be larger than the width W1 of the first barrier pattern 302 (i.e., W3>W1). The width W1 of the first barrier pattern 302 may be larger than the width W2 of the second barrier pattern 304 (i.e., W1>W2). In other words, the metal pattern 306 may have the largest width W3, and the second barrier pattern 304 may have the smallest width W2. A side surface of the first barrier pattern 302, a side surface of the second barrier pattern 304, and a side surface of the metal pattern 306 may be misaligned to (i.e., may not be vertically aligned with) each other. A width of the first metal pattern 306a may be equal to a width of the second metal pattern 306b, and a side surface of the first metal pattern 306a may be aligned to a side surface of the second metal pattern 306b. Side surfaces of the first barrier pattern 302, side surfaces of the second barrier pattern 304, and side surfaces of the metal pattern 306 may be perpendicular to the specific surface 4 of the third insulating layer 202c and may each be substantially flat. In some embodiments, referring to FIG. 2C, side surfaces of the first barrier pattern 302, side surfaces of the second barrier pattern 304, and side surfaces of the metal pattern 306 may be perpendicular to the specific surface 4 of the third insulating layer 202c and may not be flat. For example, the side surfaces of the first and second barrier patterns 302 and 304 and side surfaces of the metal pattern 306 may each be uneven or rough, as shown in FIG. 2C.

Referring back to FIG. 2A, the metal film 308 may be disposed on the metal pattern 306. The metal film 308 may be in contact with a specific surface of the metal pattern 306. Though FIG. 2A illustrates a width of the metal film 308 to be larger than the width W3 of the metal pattern 306, the width of the metal film 308 is not limited thereto. For example, the width of the metal film 308 may be larger or smaller than or equal to the width W3 of the metal pattern 306. The metal film 308 may be formed of or include a metallic material. For example, the metal film 308 may include nickel (Ni).

The connection terminal 320 may be disposed on the metal film 308. The connection terminal 320 may be in contact with a specific surface of the metal film 308. The connection terminal 320 may not cover a side surface of the metal pattern 306 or side surfaces of the first and second barrier patterns 302 and 304. In other words, the connection terminal 320 may be provided to expose the side surface of the metal pattern 306 and the side surfaces of the first and second barrier patterns 302 and 304. The connection terminal 320 may be spaced apart from the specific surface 4 of the third insulating layer 202c, the side surface of the metal pattern 306, the side surface of the first barrier pattern 302, and the side surface of the second barrier pattern 304. The connection terminal 320 may include a solder ball, a bump, or a pillar. The connection terminal 320 may be formed of or include at least one of metallic materials (e.g., tin (Sn), lead (Pb), nickel (Ni), gold (Au), silver (Ag), copper (Cu), and bismuth (Bi)).

Referring to FIG. 2D, in some embodiments, the metal film 308 may be omitted, unlike that shown in FIGS. 2A and 2C. In other words, the UBM layer 310 may not include the metal film 308. Accordingly, the connection terminal 320 may be in contact with a specific surface of the metal pattern 306.

Referring back to FIG. 1, the mold layer 400 may be disposed on a specific surface 6 of the first insulating layer 202a. The mold layer 400 may cover the specific surface 6 of the first insulating layer 202a of the mold layer 400, side surfaces of the first protection layer 104, and side and top surfaces of the first semiconductor chip 100. The mold layer 400 may include an epoxy molding compound.

The first semiconductor package 1000 may be disposed on a board 2000. For example, the first terminal structures 300 may be disposed on a first surface of the board 2000. The board 2000 may be, for example, a printed circuit board (PCB). Outer terminals 500 may be disposed on a second surface, which is opposite to the first surface of the board 2000. Each of the outer terminals 500 may be electrically connected to a corresponding one of the first terminal structures 300. The outer terminals 500 may include solder balls, bumps, or pillars. The outer terminals 500 may be formed of or include at least one of metallic materials (e.g., tin (Sn), lead (Pb), nickel (Ni), gold (Au), silver (Ag), copper (Cu), and bismuth (Bi)).

Figure 3:
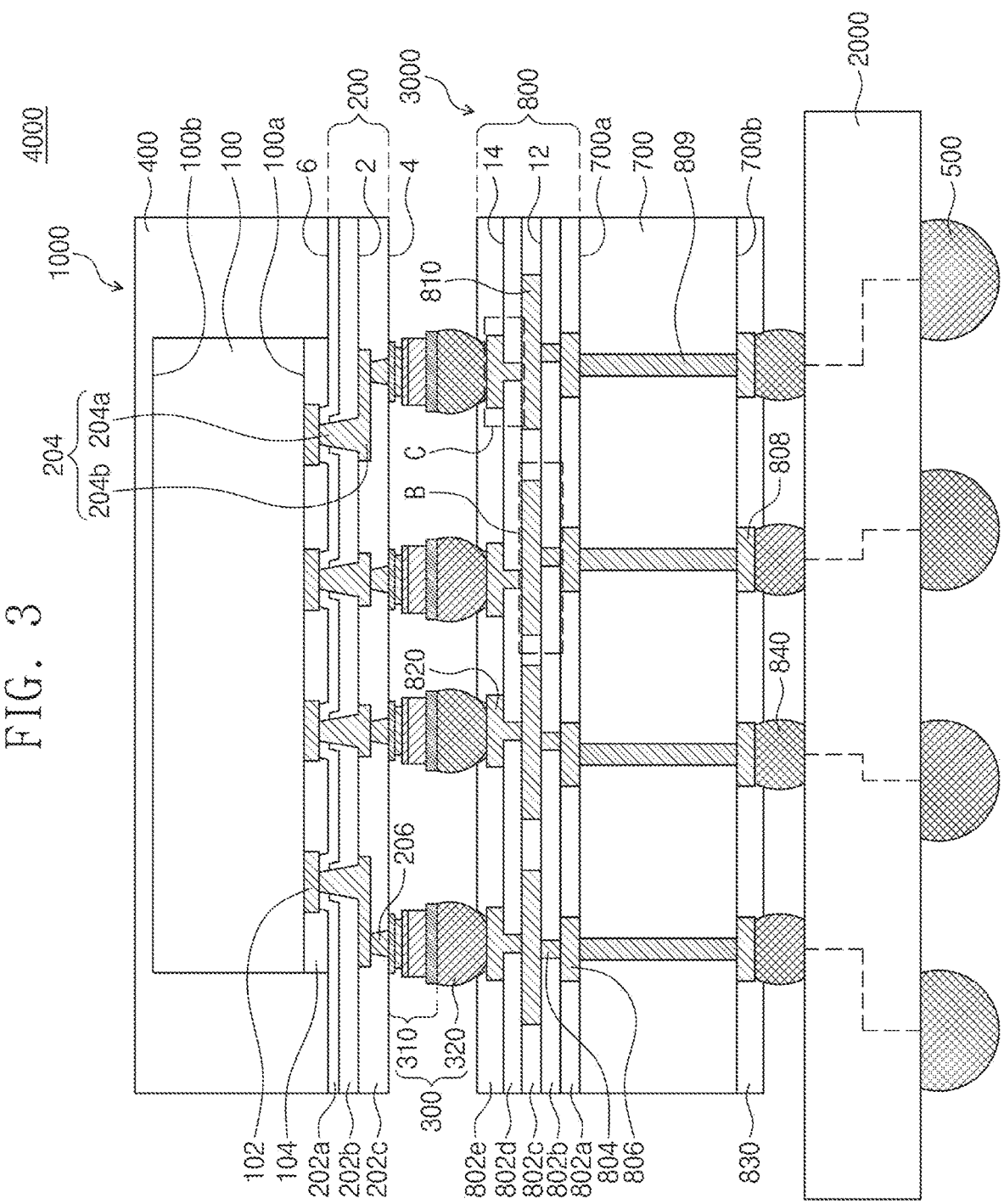
FIG. 3 is a sectional view illustrating a semiconductor package including a semiconductor device according to some embodiments of the inventive concepts.
Figure 4A:
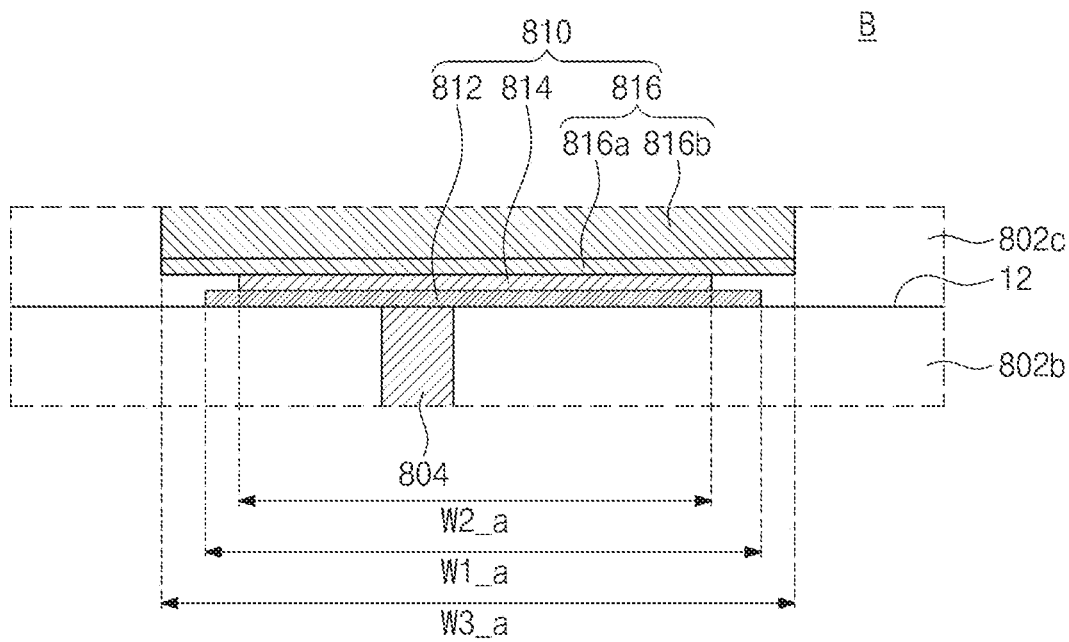
FIG. 4A is an enlarged sectional view illustrating a portion B of FIG. 3.
Figure 4B:
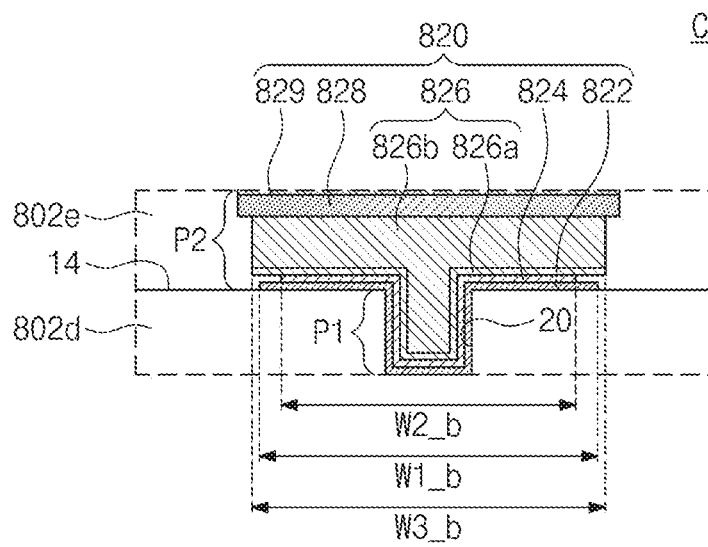
FIG. 4B is an enlarged sectional view illustrating a portion C of FIG. 3.

FIG. 3 is a sectional view illustrating a semiconductor package including a semiconductor device according to some embodiments of the inventive concepts. FIG. 4A is an enlarged sectional view illustrating a portion B of FIG. 3. FIG. 4B is an enlarged sectional view illustrating a portion C of FIG. 3.

Referring to FIG. 3, a semiconductor package 4000 may include the first semiconductor package 1000 and a second semiconductor package 3000. The first semiconductor package 1000 may be disposed on the second semiconductor package 3000. Since the first semiconductor package 1000 has been described with reference to FIG. 1, a repeated description of the first semiconductor package 1000 will be omitted.

The second semiconductor package 3000 may include a second semiconductor chip 700, a second re-distribution layer 800, second chip pads 806, third chip pads 808, and second terminal structures 840. The second semiconductor chip 700 may include a first surface 700a and a second surface 700b, which are opposite to each other. The first surface 700a may correspond to an active surface of the second semiconductor chip 700, and the second surface 700b may correspond to an inactive surface of the second semiconductor chip 700. The second chip pads 806 may be disposed on the first surface 700a of the second semiconductor chip 700. The second chip pads 806 may be in contact with the first surface 700a of the second semiconductor chip 700. The second chip pads 806 may include a metallic material, such as aluminum (Al). The third chip pads 808 may be disposed on the second surface 700b of the second semiconductor chip 700. The third chip pads 808 may be in contact with the second surface 700b of the second semiconductor chip 700. The third chip pads 808 may be formed of or include a metallic material, such as aluminum (Al). A second protection layer 830 may be disposed on the second surface 700b of the second semiconductor chip 700. The second protection layer 830 may cover the second surface 700b of the second semiconductor chip 700 and side surfaces of the third chip pads 808. The second protection layer 830 may expose specific surfaces (e.g., surfaces that are parallel to, and do not contact, the second surface 700b) of the third chip pads 808. Through vias 809 may be provided to penetrate the second semiconductor chip 700. The through vias 809 may be disposed between the second chip pads 806 and the third chip pads 808 and may electrically connect the second chip pads 806 to the third chip pads 808. The through vias 809 may be formed of or include at least one of semiconductor materials (e.g., silicon) or conductive materials (e.g., metallic materials).

The second re-distribution layer 800 may be disposed on the first surface 700a of the second semiconductor chip 700. The second re-distribution layer 800 may include fourth to eighth insulating layers 802a, 802b, 802c, 802d, and 802e, vias 804, redistributions 810, and pads 820. The fourth to eighth insulating layers 802a, 802b, 802c, 802d, and 802e may be sequentially stacked on the first surface 700a of the second semiconductor chip 700. The fourth to eighth insulating layers 802a, 802b, 802c, 802d, and 802e may be formed of or include at least one of a polymer layer or a silicon oxide layer. The polymer layer may be a photosensitive polymer (e.g., photosensitive polyimide (PSPI), polybenzoxazole (PBO), phenolic polymer, or benzocyclobutene polymer (BCB)). The fourth insulating layer 802a may cover the first surface 700a of the second semiconductor chip 700 and side surfaces of the second chip pads 806. The fifth insulating layer 802b may be disposed on the fourth insulating layer 802a. The fifth insulating layer 802b may cover specific surfaces of the second chip pads 806 and a specific surface of the fourth insulating layer 802a. The vias 804 may be disposed in the fifth insulating layer 802b. The vias 804 may be provided to penetrate the fifth insulating layer 802b and may be in contact with the second chip pads 806. The vias 804 may be formed of or include at least one of conductive materials. In some embodiments, the vias 804 may be conductive and thus may be referred to as conductive elements. The sixth insulating layer 802c may be disposed on the fifth insulating layer 802b. The sixth insulating layer 802c may cover a specific surface of the fifth insulating layer 802b.

The redistributions 810 may be disposed in the sixth insulating layer 802c. The redistributions 810 may be provided to penetrate the sixth insulating layer 802c. Each of the redistributions 810 may be disposed to correspond to a respective one of the vias 804. The redistributions 810 may be in contact with a specific surface 12 of the fifth insulating layer 802b and specific surfaces of the vias 804, which are exposed by the fifth insulating layer 802b. In some embodiments, the redistributions 810 may be conductive and thus may be referred to as conductive elements. Referring to FIG. 4A, each of the redistributions 810 may include a first barrier pattern 812, a second barrier pattern 814, and a metal pattern 816, which are sequentially stacked on the specific surface 12 of the fifth insulating layer 802b. The first barrier pattern 812 may be in contact with a specific surface of each of the vias 804 and the specific surface 12 of the fifth insulating layer 802b. The first barrier pattern 812 may be formed to have a thin thickness. For example, the thickness of the first barrier pattern 812 may range from about 10 Å to about 100 Å. The first barrier pattern 812 may be formed of or include at least one of metal nitrides. For example, the first barrier pattern 812 may include titanium nitride (TiN). The second barrier pattern 814 may be disposed on the first barrier pattern 812. The second barrier pattern 814 may be in contact with a specific surface of the first barrier pattern 812. The second barrier pattern 814 may serve as a diffusion barrier layer. The second barrier pattern 814 may be formed of or include at least one of metallic materials. A metallic element included in the second barrier pattern 814 may be the same as a metallic element included in the first barrier pattern 812. For example, the second barrier pattern 814 may be formed of or include titanium (Ti). The metal pattern 816 may be disposed on the second barrier pattern 814. The metal pattern 816 may be in contact with a specific surface of the second barrier pattern 814. The metal pattern 816 may include a first metal pattern 816a and a second metal pattern 816b, which are sequentially stacked on the specific surface of the second barrier pattern 814. The second metal pattern 816b may be thicker than the first metal pattern 816a. The first metal pattern 816a and the second metal pattern 816b may be formed of or include the same metallic material. The first metal pattern 816a and the second metal pattern 816b may be formed of or include, for example, copper (Cu).

In some embodiments, a width $W1\_a$ of the first barrier pattern 812, a width $W2\_a$ of the second barrier pattern 814, and a width $W3\_a$ of the metal pattern 816 may differ from each other. The width $W3\_a$ of the metal pattern 816 may be larger than the width $W1\_a$ of the first barrier pattern 812 (i.e., $W3\_a > W1\_a$). The width $W1\_a$ of the first barrier pattern 812 may be larger than the width $W2\_a$ of the second barrier pattern 814 (i.e., $W1\_a > W2\_a$). In other words, the metal pattern 816 may have the largest width $W3\_a$, and the second barrier pattern 814 may have the smallest width $W2\_a$. A side surface of the first barrier pattern 812, a side surface of the second barrier pattern 814, and a side surface of the metal pattern 816 may be misaligned to each other. A width of the first metal pattern 816a may be equal to a width of the second metal pattern 816b, and a side surface of the first metal pattern 816a may be aligned to a side surface of the second metal pattern 816b. Side surfaces of the first barrier pattern 812, side surfaces of the second barrier pattern 814, and side surfaces of the metal pattern 816 may be perpendicular to the specific surface 12 of the fifth insulating layer 802b and may be substantially flat. In some embodiments, however, side surfaces of the first barrier pattern 812, side surfaces of the second barrier pattern 814, and side surfaces of the metal pattern 816 may be perpendicular to the specific surface 12 of the fifth insulating layer 802b and may not be flat (i.e., may be uneven).

In some embodiments, the redistributions 204 of the first re-distribution layer 200 may have the same stacking structure as the redistributions 810 of the second re-distribution layer 800 and may include a plurality of layers, which are substantially the same as layers constituting the redistributions 810 of the second re-distribution layer 800. For example, the redistributions 204 may include a first barrier pattern, a second barrier pattern, and a metal pattern. The first barrier patterns of the redistributions 204, which correspond to the first barrier patterns 812 (e.g., see FIG. 4A) of the redistributions 810, may be in contact with the specific surface 2 of the second insulating layer 202b. The metal patterns of the redistributions 204, which correspond to the metal pattern 816 (e.g., see FIG. 4A) of the redistributions 810, may be in contact with the vias 206.

Referring back to FIG. 3, the seventh insulating layer 802d may be disposed on a specific surface of the sixth insulating layer 802c and specific surfaces of the redistributions 810. The seventh insulating layer 802d may cover the specific surface of the sixth insulating layer 802c and the specific surfaces of the redistributions 810. The pads 820 may be disposed in the seventh insulating layer 802d. The pads 820 may be provided to penetrate the seventh insulating layer 802d and to be in contact with the specific surfaces of the redistributions 810. Each of the pads 820 may be disposed to correspond to a respective one of the redistributions 810. Referring to FIG. 4B, each of the pads 820 may include a first portion P1 and a second portion P2. The first portion P1 may be provided to penetrate the seventh insulating layer 802d, and the second portion P2 may be disposed on a specific surface 14 of the seventh insulating layer 802d. The second portion P2 may be extended from the first portion P1 to cover the specific surface 14 of the seventh insulating layer 802d. The first portion P1 of each pad 820 may be in contact with a respective one of the redistributions 810. The second portion P2 of the pad 820 may be in contact with the specific surface 14 of the seventh insulating layer 802d. In some embodiments, the pads 820 may be conductive and thus may be referred to as conductive elements.

Each of the pads 820 may include a first barrier pattern 822, a second barrier pattern 824, a metal pattern 826, a first metal film 828, and a second metal film 829. The first barrier pattern 822 may cover a specific surface of the redistribution 810, side surfaces of a penetration hole 20 of the seventh insulating layer 802d, and the specific surface 14 of the seventh insulating layer 802d. The first barrier pattern 822 may be in contact with the specific surface of the redistribution 810, the side surfaces of the penetration hole 20 of the seventh insulating layer 802d, and the specific surface 14 of the seventh insulating layer 802d. For example, the first barrier pattern 822 may be in contact with a specific surface of the metal pattern 816 of the redistribution 810, which is exposed by the sixth insulating layer 802c. The first barrier pattern 822 may be formed to have a thin thickness. For example, the thickness of the first barrier pattern 822 may range from about 10 Å to about 100 Å. The first barrier pattern 822 may be formed of or include at least one of metal nitrides. For example, the first barrier pattern 822 may be formed of or include titanium nitride (TiN). The second barrier pattern 824 may be disposed on the first barrier pattern 822. The second barrier pattern 824 may be in contact with bottom and side surfaces of the first barrier pattern 822, which is placed in the penetration hole 20, and a top surface of the first barrier pattern 822, which is placed on the specific surface 14 of the seventh insulating layer 802d. The second barrier pattern 824 may be used as a diffusion barrier layer. The second barrier pattern 824 may be formed of or include at least one of metallic materials. A metallic element included in the second barrier pattern 824 may be the same as a metallic element included in the first barrier pattern 822. For example, the second barrier pattern 824 may be formed of or include titanium (Ti). The metal pattern 826 may be disposed on the second barrier pattern 824. The metal pattern 826 may be in contact with bottom and side surfaces of the second barrier pattern 824, which is placed in the penetration hole 20, and a top surface of the second barrier pattern 824, which is placed on the specific surface 14 of the seventh insulating layer 802d. The metal pattern 826 may be provided to completely fill the penetration hole 20. The metal pattern 826 may include a first metal pattern 826a and a second metal pattern 826b, which are sequentially stacked on the bottom, side, and top surfaces of the second barrier pattern 824. The second metal pattern 826b may be thicker than the first metal pattern 826a. The first metal pattern 826a and the second metal pattern 826b may include the same metallic material. For example, the first metal pattern 826a and the second metal pattern 826b may include copper (Cu). The first metal film 828 may be disposed on the metal pattern 826. The first metal film 828 may be in contact with a specific surface of the metal pattern 826. The first metal film 828 may be formed of or include a metallic material. For example, the first metal film 828 may include nickel (Ni). The second metal film 829 may be disposed on the first metal film 828. The second metal film 829 may be in contact with a specific surface of the first metal film 828. The second metal film 829 may be configured to increase an adhesive strength between the pad 820 and terminals, which will be disposed on the pad 820. The second metal film 829 may be formed of or include at least one of metallic materials (e.g., Au).

In some embodiments, a width W1_b of the first barrier pattern 822, a width W2_b of the second barrier pattern 824, and a width W3_b of the metal pattern 826 may differ from each other. The width W3_b of the metal pattern 826 may be larger than the width W1_b of the first barrier pattern 822 (i.e., W3_b>W1_b). The width W1_b of the first barrier pattern 822 may be larger than the width W2_b of the second barrier pattern 824 (i.e., W1_b>W2_b). In other words, the metal pattern 826 may have the largest width W3_b, and the second barrier pattern 824 may have the smallest width W2_b. Though a width of the first metal film 828 is illustrated in FIG. 4B to be larger than the width W3_b of the metal pattern 826, the width of the first metal film 828 is not limited thereto. For example, the width of the first metal film 828 may be larger or smaller than or equal to the width W3_b of the metal pattern 826.

Side surfaces of the first barrier pattern 822, the second barrier pattern 824, and the metal pattern 826, which are disposed on the specific surface 14 of the seventh insulating layer 802d, may be misaligned to each other. A width of the first metal pattern 826a may be equal to a width of the second metal pattern 826b, and side surfaces of the first metal pattern 826a and the second metal pattern 826b, which are disposed on the specific surface 14 of the seventh insulating layer 802d, may be aligned to each other. The side surfaces of the first barrier pattern 822, the second barrier pattern 824, and the metal pattern 826 may be perpendicular to the specific surface 14 of the seventh insulating layer 802d and may be substantially flat. In some embodiments, however, the side surfaces of the first barrier pattern 822, the second barrier pattern 824, and the metal pattern 826 may be perpendicular to the specific surface 14 of the seventh insulating layer 802d and may not be flat (i.e., may be uneven).

Referring back to FIG. 3, the eighth insulating layer 802e may be disposed on the seventh insulating layer 802d. The eighth insulating layer 802e may cover the specific surface 14 of the seventh insulating layer 802d and the side surfaces of the second portion P2 (e.g., see FIG. 4B) of the pads 820. The eighth insulating layer 802e may be provided to expose specific (e.g., top) surfaces of the second portion P2 (e.g., see FIG. 4B) of the pads 820. The specific surfaces of the second portion P2 (e.g., see FIG. 4B) of the pads 820 may correspond to (e.g., may be) specific (e.g., top) surfaces of the second metal films 829 (e.g., see FIG. 4B). The first semiconductor package 1000 may be provided on the second semiconductor package 3000. In detail, the first terminal structures 300 of the first semiconductor package 1000 may be disposed on the pads 820. The connection terminals 320 of the first terminal structures 300 may be disposed on the pads 820. The connection terminals 320 may be in contact with the second metal films 829 (e.g., see FIG. 4B) of the pads 820.

The second terminal structures 840 may be disposed on the third chip pads 808. In some embodiments, the second terminal structures 840 may have the same stacking structure as the first terminal structures 300 of the first semiconductor package 1000 and may include a plurality of layers, which are substantially the same as layers constituting the first terminal structures 300 of the first semiconductor package 1000. For example, the second terminal structures 840 may include a first barrier pattern, a second barrier pattern, a metal pattern, metal film, and a first connection terminal. In some embodiments, connection terminals of the second terminal structures 840, which correspond to the connection terminals 320 of the first terminal structures 300, may be in contact with a specific (e.g., top) surface of the board 2000, and the first barrier patterns of the second terminal structures 840, which correspond to the first barrier patterns 302 (e.g., see FIG. 2A) of the first terminal structures 300, may be in contact with specific (e.g., bottom) surfaces of the third chip pads 808 and a specific (e.g., side) surface of the second protection layer 830. In some embodiments, the second terminal structures 840 may be composed of only terminals, such as solder balls, bumps, or pillars. The second terminal structures 840 may be electrically connected to the outer terminals 500.

Figure 5:
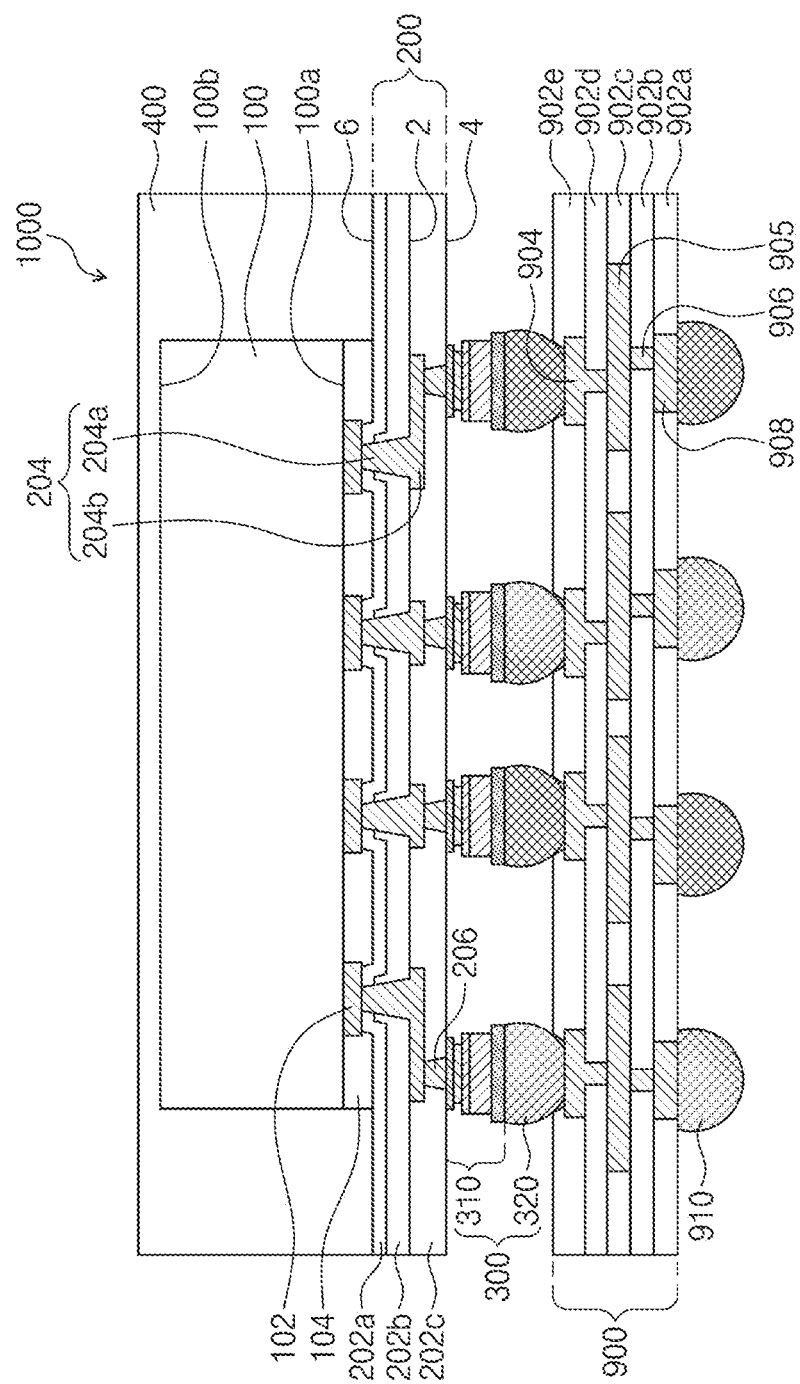
FIG. 5 is a sectional view illustrating a semiconductor package including a semiconductor device according to some embodiments of the inventive concepts.

FIG. 5 is a sectional view illustrating a semiconductor package including a semiconductor device according to some embodiments of the inventive concepts.

Referring to FIG. 5, the first semiconductor package 1000 may be disposed on a redistribution substrate 900. The redistribution substrate 900 may include first to fifth insulating layers 902a, 902b, 902c, 902d, and 902e, first and second pads 904 and 908, redistributions 905, and vias 906. The second to fifth insulating layers 902b, 902c, 902d, and 902e may be sequentially stacked on the first insulating layer 902a. The first pads 904 may be provided to penetrate the fourth insulating layer 902d and may be in contact with side surfaces of the fifth insulating layer 902e. The first pads 904 of the redistribution substrate 900 may have the same stacking structure as the pads 820 of the second re-distribution layer 800 shown in FIGS. 3 and 4B and may include a plurality of layers, which are substantially the same as layers constituting the pads 820 of the second re-distribution layer 800. For example, the first pads 904 may include a first barrier pattern, a second barrier pattern, a metal pattern, a first metal film, and a second metal film. In some embodiments, the connection terminals 320 of the first semiconductor package 1000 may be in contact with the second metal films of the first pads 904, which correspond to the second metal films 829 of the pads 820 (e.g., see FIG. 4B). In addition, the first barrier patterns of the first pads 904, which correspond to the first barrier pattern 822 of the pads 820 (e.g., see FIG. 4B), may be in contact with the side surfaces of the fifth insulating layer 902e.

The redistributions 905 of the redistribution substrate 900 may be disposed in the third insulating layer 902c. The redistributions 905 may have the same stacking structure as the redistributions 810 of the second re-distribution layer 800 described with reference to FIGS. 3 and 4A and may include a plurality of layers, which are substantially the same as layers constituting the redistributions 810 of the second re-distribution layer 800. For example, the redistributions 905 may include a first barrier pattern, a second barrier pattern, and a metal pattern. In some embodiments, the first barrier patterns of the redistributions 905, which correspond to the first barrier patterns 812 of the redistributions 810 (e.g., see FIG. 3A), may be in contact with a specific surface (e.g., a top surface) of the second insulating layer 902b and the vias 906, and the metal patterns of the redistributions 905, which correspond to the metal patterns 816 of the redistributions 810 (e.g., see FIG. 3A), may be in contact with the first pads 904. The vias 906 may be provided to penetrate the second insulating layer 902b. The second pads 908 may be disposed in the first insulating layer 902a. The second pads 908 may be in contact with the vias 906. The second pads 908 may be formed of or include at least one of metallic materials (e.g., aluminum). In some embodiments, the second pads 908 may have the same stacking structure as the first pads 904 and may include a plurality of layers, which are substantially the same as layers constituting the first pads 904. For example, the second pads 908 may include a first barrier pattern, a second barrier pattern, a metal pattern, a first metal film, and a second metal film. Outer terminals 910 may be disposed on the second pads 908. The outer terminals 910 may have the same stacking structure as the first terminal structures 300 of the first semiconductor package 1000 and may include a plurality of layers, which are substantially the same as layers constituting the first terminal structures 300 of the first semiconductor package 1000. In some embodiments, the outer terminals 910 may be composed of only terminals, such as solder balls, bumps, or pillars.

Figure 6:
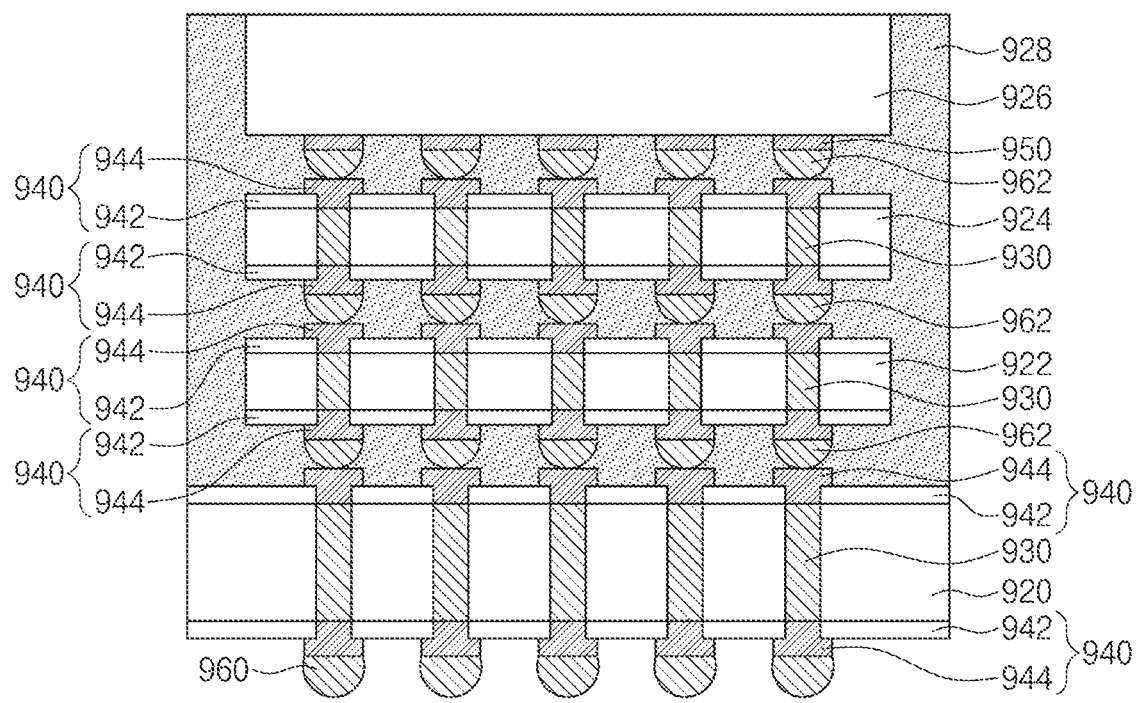
FIG. 6 is a sectional view illustrating a chip stack including a semiconductor device according to some embodiments of the inventive concepts.

FIG. 6 is a sectional view illustrating a chip stack including a semiconductor device according to some embodiments of the inventive concepts.

A chip stack 5000 may include a first chip 920, a second chip 922, a third chip 924, a fourth chip 926, and a chip mold layer 928. The second chip 922 may be stacked on the first chip 920, the third chip 924 may be stacked on the second chip 922, and the fourth chip 926 may be stacked on the third chip 924. In other words, the second chip 922, the third chip 924, and the fourth chip 926 may be sequentially stacked on the first chip 920. As an example, the first chip 920 may be a semiconductor logic chip, and the second to fourth chips 922, 924, and 926 may be semiconductor memory chips. A width of the first chip 920 may be greater than widths of the second to fourth chips 922, 924, and 926.

Through vias 930 may be disposed in the first to third chips 920, 922, and 924. The through vias 930 may be provided to penetrate the first to third chips 920, 922, and 924. The through vias 930 may not be provided in the fourth chip 926. The through vias 930 may be formed of or include at least one of metallic materials (e.g., copper, tungsten, aluminum) or semiconductor materials (e.g., silicon). Re-distribution layers 940 may be disposed on top and bottom surfaces of the first to third chips 920, 922, and 924. The re-distribution layers 940 may include insulating layers 942 and pads 944. The insulating layers 942 may cover the top and bottom surfaces of the first to third chips 920, 922, and 924. The pads 944 may be provided to penetrate the insulating layers 942 and may be extended onto specific surfaces of the insulating layers 942. In some embodiments, the re-distribution layers 940 may further include vias and redistributions. The pads 944 may have the same stacking structure as the pads 820 shown in FIG. 4B and may include a plurality of layers, which are substantially the same as layers constituting the pads 820. For example, each of the pads 944 may include a first barrier pattern, a second barrier pattern, a metal pattern, a first metal film, and a second metal film. The first barrier patterns of the pads 944 may be in contact with specific surfaces of the insulating layers 942.

The pads 944, which are disposed on the top and bottom surfaces of the first chip 920, may be disposed on the through vias 930 penetrating the first chip 920. The pads 944, which are disposed on the top and bottom surfaces of the second chip 922, may be disposed on top and bottom surfaces of the through vias 930 penetrating the second chip 922. The pads 944, which are disposed on the top and bottom surfaces of the third chip 924, may be disposed on top and bottom surfaces of the through vias 930 penetrating the third chip 924. In addition, pads 950, which are disposed on a bottom surface of the fourth chip 926, may be disposed to correspond to (e.g., may be on) the pads 944 disposed on a top surface of the third chip 924. The pads 950, which are disposed on the bottom surface of the fourth chip 926, may have the same stacking structure as the pads 820 shown in FIG. 4B and may include a plurality of layers, which are substantially the same as layers constituting the pads 820. For example, each of the pads 820 may include a first barrier pattern, a second barrier pattern, a metal pattern, a first metal film, and a second metal film.

First terminals 960 may be disposed on the pads 944, which are disposed on the bottom surface of the first chip 920. Second terminals 962 may be disposed between the first chip 920 and the second chip 922, between the second chip 922 and the third chip 924, and between the third chip 924 and the fourth chip 926. For example, the second terminals 962 may be disposed between the pads 944 on the top surface of the first chip 920 and the pads 944 on the bottom surface of the second chip 922. The second terminals 962 may be disposed between the pads 944 on the top surface of the second chip 922 and the pads 944 on the bottom surface of the third chip 924. In addition, the second terminals 962 may be disposed between the pads 944 on the top surface of the third chip 924 and the pads 950 on the bottom surface of the fourth chip 926. The first and second terminals 960 and 962 may be formed of or include at least one of metallic materials (e.g., tin (Sn), lead (Pb), nickel (Ni), gold (Au), silver (Ag), copper (Cu), and bismuth (Bi)).

The chip mold layer 928 may be disposed on the top surface of the first chip 920. The chip mold layer 928 may be disposed on the top surface of the first chip 920 to cover side surfaces of the second to fourth chips 922, 924, and 926. The chip mold layer 928 may fill a space between the first chip 920 and the second chip 922, a space between the second chip 922 and the third chip 924, and a space between the third chip 924 and the fourth chip 926. The chip mold layer 928 may be formed of or include an epoxy molding compound (EMC).

FIGS. 7A to 7D are sectional views illustrating a method of fabricating a semiconductor package including a semiconductor device, according to some embodiments of the inventive concepts.

Figure 7A:
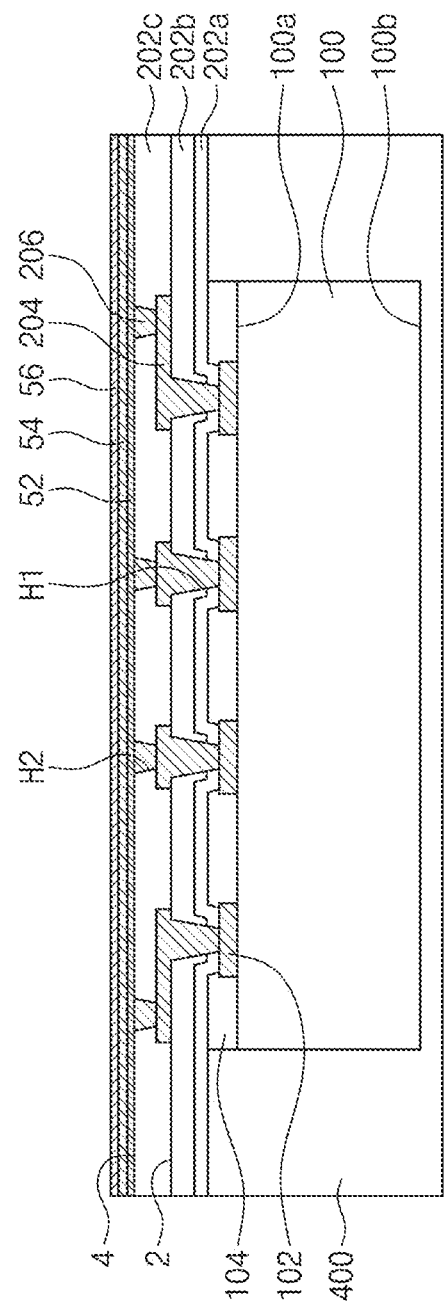
FIGS. 7A to 7D are sectional views illustrating a method of fabricating a semiconductor package including a semiconductor device, according to some embodiments of the inventive concepts.

Referring to FIG. 7A, the first chip pads 102 may be formed on the first surface 100a of the first semiconductor chip 100. The formation of the first chip pads 102 may include forming a conductive layer on the first surface 100a of the first semiconductor chip 100 and then patterning the conductive layer. The first protection layer 104 may be formed on the first surface 100a of the first semiconductor chip 100. The first protection layer 104 may cover the side surfaces of the first chip pads 102 and expose specific surfaces of the first chip pads 102. The mold layer 400 may be formed to cover side surfaces of the first semiconductor chip 100, side surfaces of the first protection layer 104, and the second surface 100b of the first semiconductor chip 100.

The first insulating layer 202a and the second insulating layer 202b may be sequentially formed on the first chip pads 102, the first protection layer 104, and the mold layer 400. The first insulating layer 202a may be formed to conformally cover a specific surface of the first protection layer 104, specific surfaces of the first chip pads 102 exposed by the first protection layer 104, and a specific surface of the mold layer 400. The second insulating layer 202b may be formed on the first insulating layer 202a. The redistributions 204 may be formed in the first and second insulating layers 202a and 202b and on the specific surface 2 of the second insulating layer 202b. The formation of the redistributions 204 may include forming first penetration holes H1 to penetrate the first and second insulating layers 202a and 202b, forming a layer to fill the first penetration holes H1 and to cover the specific surface 2 of the second insulating layer 202b, and patterning the layer. In some embodiments, the first penetration holes H1 may be formed to expose specific surfaces of the first chip pads 102. The redistributions 204 may include a single layer or a plurality of layers. The redistributions 204 may be formed of or include at least one of metallic or metal nitride layers. The third insulating layer 202c may be formed on the specific surface 2 of the second insulating layer 202b. The third insulating layer 202c may be formed to cover specific and side surfaces of the redistributions 204, which are formed on the specific surface 2 of the second insulating layer 202b. The vias 206 may be disposed in the third insulating layer 202c. The formation of the vias 206 may include forming second penetration holes H2 in the third insulating layer 202c and filling the second penetration holes H2 with a metallic material.

A first barrier layer 52, a second barrier layer 54, and a seed layer 56 may be sequentially formed on the specific surface 4 of the third insulating layer 202c. The first barrier layer 52 may be in contact with the specific surface 4 of the third insulating layer 202c and the specific surfaces of the vias 206. The first barrier layer 52 may be formed using a deposition process (e.g., PVD, CVD, or ALD). The first barrier layer 52 may be formed of or include at least one of metal nitrides. For example, the first barrier layer 52 may be formed of or include a titanium nitride layer (TiN). The first barrier layer 52 may be formed to a thickness, which is chosen to reduce influence on resistance and to prevent the second barrier layer 54 from being excessively etching in a subsequent etching process. The first barrier layer 52 may be formed to have a thickness of about 10 Å to about 100 Å. The second barrier layer 54 may be formed on the first barrier layer 52. The second barrier layer 54 may be formed using a deposition process (e.g., physical vapor deposition (PVD), chemical vapor deposition (CVD), or atomic layer deposition (ALD)). The second barrier layer 54 may be formed of or include at least one of metallic materials. For example, the second barrier layer 54 may be formed of or include titanium (Ti). The seed layer 56 may be formed on the second barrier layer 54. The seed layer 56 may be formed using a deposition process (e.g., PVD, CVD, or ALD). The seed layer 56 may be a layer that will be used in a subsequent plating process. The seed layer 56 may be used to improve a deposition rate of metal in the subsequent plating process. The seed layer 56 may be formed of or include at least one of metallic materials. For example, the seed layer 56 may be formed of or include copper (Cu).

Figure 7B:
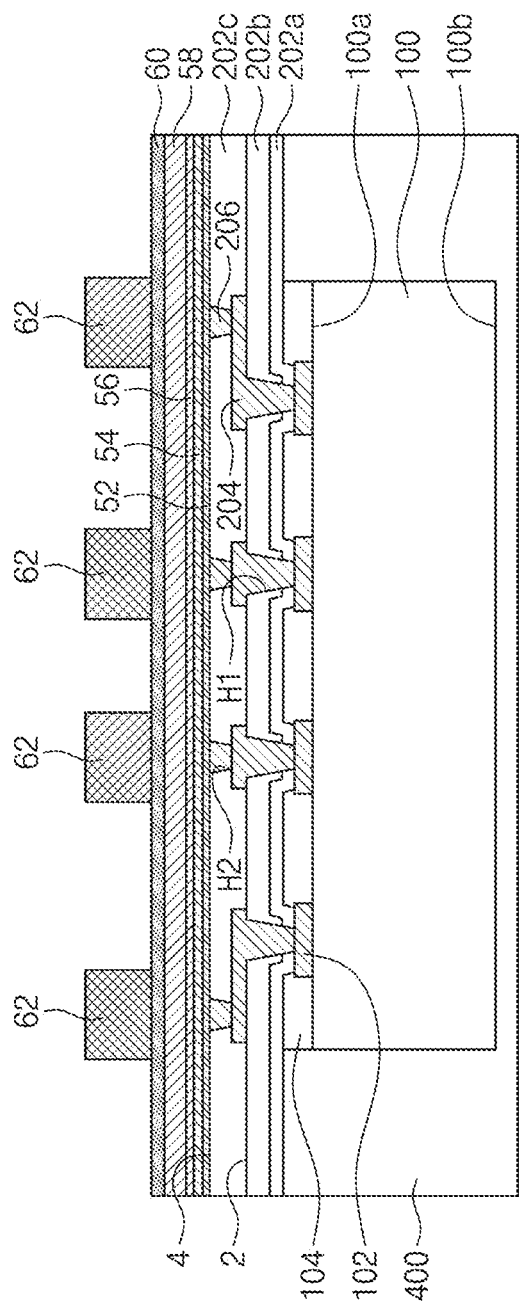

Referring to FIG. 7B, a first plating layer 58 and a second plating layer 60 may be sequentially formed on the seed layer 56. The first plating layer 58 and the second plating layer 60 may be formed using a plating process. In some embodiments, the first plating layer 58 may be formed of or include copper (Cu), and the second plating layer 60 may be formed of or include nickel (Ni). The first plating layer 58 and the second plating layer 60 may be formed in an in-situ manner.

Terminal patterns 62 may be formed on the second plating layer 60. As an example, the terminal patterns 62 may be formed by forming a metal layer on the second plating layer 60 and patterning the metal layer. In some embodiments, the formation of the terminal patterns 62 may include forming a sacrificial layer with holes on the second plating layer 60, filling the holes with a metallic material, and then removing the sacrificial layer. The terminal patterns 62 may be formed of or include at least one of metallic materials (e.g., tin (Sn), lead (Pb), nickel (Ni), gold (Au), silver (Ag), copper (Cu), and bismuth (Bi)).

Figure 7C:
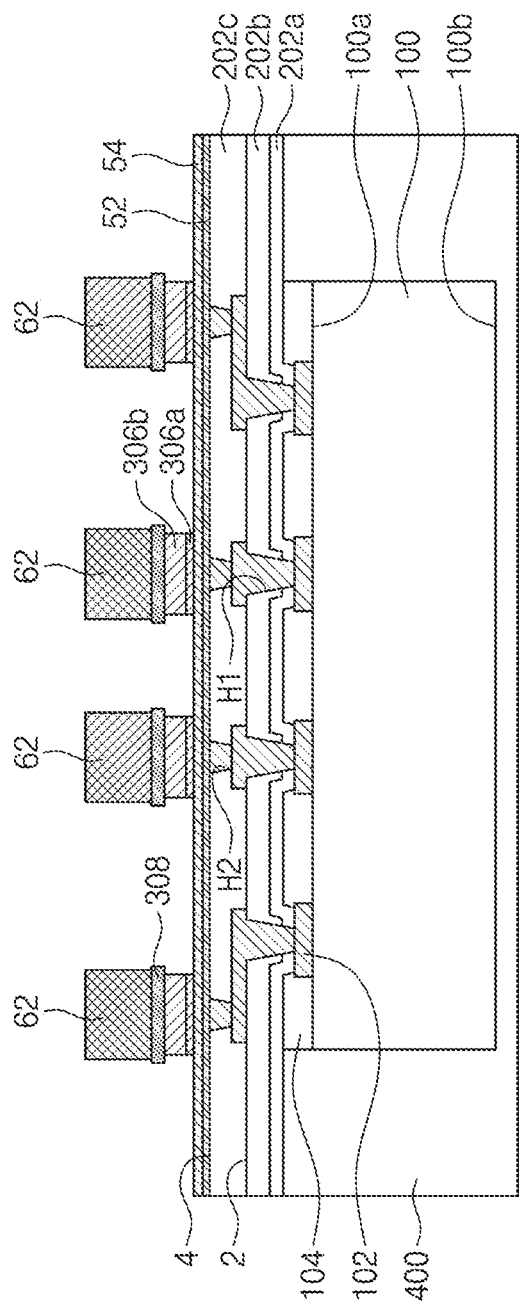

Referring to FIG. 7C, the second plating layer 60, the first plating layer 58, and the seed layer 56 may be sequentially patterned using the terminal patterns 62 as an etch mask. Accordingly, the first metal patterns 306a, the second metal patterns 306b, and the metal films 308 may be sequentially formed on the second barrier layer 54. The terminal patterns 62 may be disposed on the metal films 308. The patterning process may be performed using a wet etching process. The wet etching process may be performed using a copper etching solution. Although the metal films 308 are illustrated to have widths larger than widths of the first and second metal patterns 306a and 306b, the inventive concepts are not limited to this example. For example, the metal films 308 may be formed to have widths that are smaller than or equal to the widths of the first and second metal patterns 306a and 306b, depending on a process condition for the etching or patterning process. Since the copper etching solution has an etch selectivity with respect to the terminal patterns 62, the terminal patterns 62 may not be removed during the etching process.

Figure 7D:
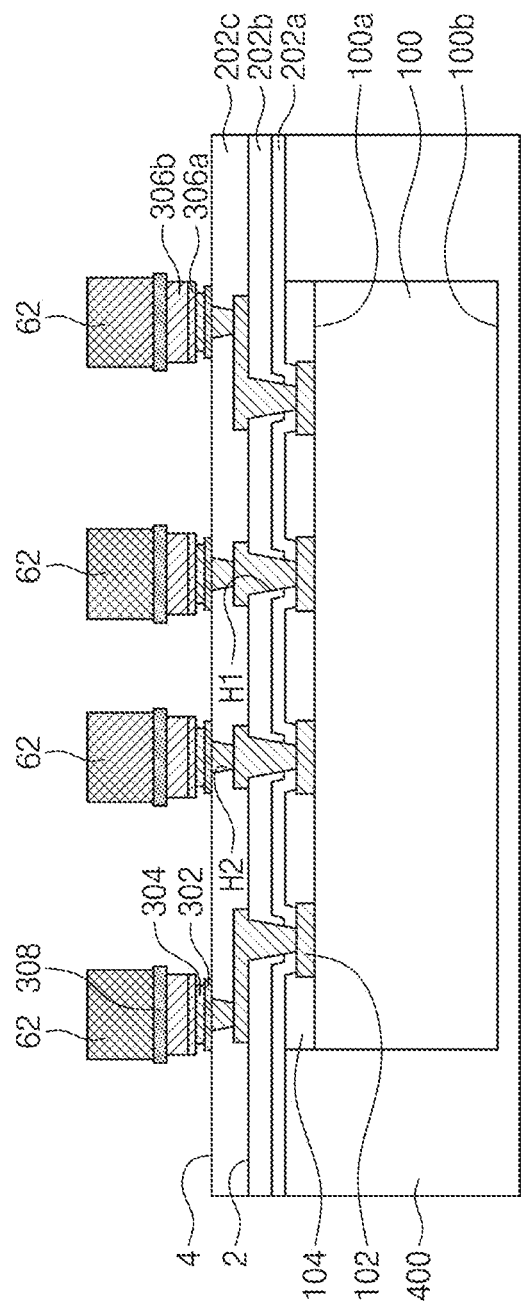

Referring to FIG. 7D, the second barrier layer 54 and the first barrier layer 52 may be sequentially patterned using the terminal patterns 62, the metal films 308, and the first and second metal patterns 306a and 306b as etch mask. Accordingly, the first barrier pattern 302 and the second barrier pattern 304 may be sequentially formed on the specific surface 4 of the third insulating layer 202c. The second barrier pattern 304 may be formed between the first barrier pattern 302 and the first metal pattern 306a. The patterning process may be performed using a wet etching process. The wet etching process may be performed using a titanium etching solution. If the wet etching process is performed using the titanium etching solution, an etch rate of the first barrier layer 52 may be lower than an etch rate of the second barrier layer 54. Thus, an etch amount of the second barrier pattern 304 may be greater than that of the first barrier pattern 302, and thus, the second barrier pattern 304 may be formed to have a width smaller than a width of the first barrier pattern 302. The first barrier pattern 302 may be formed to have a width smaller than widths of the first and second metal patterns 306a and 306b.

According to some embodiments of the inventive concepts, the first barrier pattern 302, which is formed of metal nitride, may be formed between the second barrier pattern 304 and the third insulating layer 202c, and this may make it possible to protect/prevent an adhesion strength between the second barrier pattern 304 and the third insulating layer 202c from being reduced by a metal oxide, which may be formed between the third insulating layer 202c and the second barrier pattern 304 when the second barrier pattern 304, which is formed of a metallic material, is directly formed on the third insulating layer 202c.

Referring back to FIG. 1, the connection terminals 320 may be formed by performing a reflow process on the terminal patterns 62. The reflow process may be performed using a low temperature process. The connection terminals 320 may be mounted on a first (e.g., top) surface of the board 2000. The connection terminals 320 may be electrically connected to the outer terminals 500, which are formed on a second (e.g., bottom) surface facing the first surface of the board 2000.

According to some embodiments of the inventive concepts, a metal nitride barrier layer may be formed between an insulating layer and a metal barrier layer of a redistribution, a pad, or an UBM layer. The metal nitride barrier layer may inhibit/prevent a metal oxide layer from being formed between the metal barrier layer and the insulating layer. Accordingly, it may be possible to improve the reliability of a semiconductor device.

Though example embodiments of the inventive concepts have been particularly shown and described, it will be understood by one of ordinary skill in the art that variations in form and detail may be made therein without departing from the scope of the attached claims.

What is claimed is:

1. A semiconductor device comprising:
a first insulating layer;
a conductive element in the first insulating layer;
a first barrier pattern in contact with a surface of the conductive element and a surface of the first insulating layer;
a second barrier pattern on the first barrier pattern; and
a first metal pattern on the second barrier pattern,
wherein the second barrier pattern is separated from the first insulating layer by the first barrier pattern,
wherein a width of the first barrier pattern is smaller than a width of the first metal pattern, and
wherein a width of the second barrier pattern is smaller than the width of the first barrier pattern.

2. The semiconductor device of claim 1, wherein the first barrier pattern comprises metal nitride.

3. The semiconductor device of claim 1, wherein the first barrier pattern has a thickness ranging from 10 angstroms (Å) to 100 Å.

4. The semiconductor device of claim 1, further comprising:
a metal film on the first metal pattern; and
a connection terminal on and in contact with the metal film,
wherein the first metal pattern comprises copper, and
wherein the metal film comprises nickel.

5. The semiconductor device of claim 1, wherein the first insulating layer comprises a polymer or oxide layer.

6. The semiconductor device of claim 1, further comprising a connection terminal on the first metal pattern,
wherein the connection terminal does not cover a side surface of the first barrier pattern and a side surface of the second barrier pattern.

7. The semiconductor device of claim 1, further comprising:
a first metal film on the first metal pattern;
a second metal film on the first metal film; and
a connection terminal on and in contact with the second metal film,
wherein the first metal pattern comprises copper,
wherein the first metal film comprises nickel, and
wherein the second metal film comprises gold.

8. The semiconductor device of claim 1, wherein the conductive element comprises:
a third barrier pattern;
a second metal pattern between the third barrier pattern and the first barrier pattern; and
a fourth barrier pattern between the third barrier pattern and the second metal pattern,
wherein the first barrier pattern is in contact with the second metal pattern.

9. The semiconductor device of claim 1, wherein a side surface of the first barrier pattern, a side surface of the second barrier pattern, and a side surface of the first metal pattern are respective flat surfaces that are perpendicular to an interface between the first barrier pattern and the conductive element.

10. The semiconductor device of claim 1, wherein a side surface of the first barrier pattern, a side surface of the second barrier pattern, and a side surface of the first metal pattern are respective uneven surfaces.

11. The semiconductor device of claim 1, further comprising a second insulating layer on the first insulating layer to cover a side surface of the first barrier pattern, a side surface of the second barrier pattern, and a side surface of the first metal pattern.

12. The semiconductor device of claim 1,
wherein the conductive element is a via, a redistribution, or a pad, and
wherein a width of the conductive element is smaller than the width of the first barrier pattern.

13. The semiconductor device of claim 1, wherein the first barrier pattern, the second barrier pattern, and the first metal pattern provide a redistribution, a pad, or an under-bump metallurgy (UBM) layer.

14. A semiconductor device comprising:
an insulating layer;
a conductive element in the insulating layer;

a first barrier pattern in contact with a surface of the conductive element and a surface of the insulating layer; and a metal pattern on the first barrier pattern, a second barrier pattern between the metal pattern and the first barrier pattern, wherein the second barrier pattern is separated from the insulating layer by the first barrier pattern;

wherein a thickness of the first barrier pattern ranges from 10 angstroms (Å) to 100 Å, and wherein the first barrier pattern comprises metal nitride.

15. The semiconductor device of claim 14, wherein the second barrier pattern comprises a metallic material.

16. The semiconductor device of claim 14, wherein a side surface of the first barrier pattern is not vertically aligned with a side surface of the metal pattern, and wherein a width of the metal pattern is larger than a width of the first barrier pattern.

17. A semiconductor device comprising:

an insulating layer;

a conductive element in the insulating layer;

a first barrier pattern and a second barrier pattern that are stacked on a surface of the conductive element and a surface of the insulating layer, wherein a first surface of the first barrier pattern contacts the surface of the conductive element and the surface of the insulating layer, and wherein a second surface of the first barrier pattern that is opposite the first surface contacts the second barrier pattern; and a metal pattern on the second barrier pattern, wherein a width of the second barrier pattern is smaller than a width of the first barrier pattern and a width of the metal pattern, and wherein the second barrier pattern comprises titanium.

18. The semiconductor device of claim 17, wherein the first barrier pattern comprises titanium nitride, and wherein the surface of the conductive element is coplanar with the surface of the insulating layer.

19. The semiconductor device of claim 17, wherein a thickness of the first barrier pattern ranges from 10 angstroms (Å) to 100 Å.

* * * * *